(12) United States Patent
Etschmaier et al.

(10) Patent No.: US 12,140,699 B2
(45) Date of Patent: Nov. 12, 2024

(54) OPTICAL SENSOR ARRANGEMENT, DEVICE AND METHOD OF MANUFACTURING AN OPTICAL SENSOR ARRANGEMENT

(71) Applicant: ams AG, Premstätten (AT)

(72) Inventors: Harald Etschmaier, Eindhoven (NL); Klaus Schmidegg, Eindhoven (NL); James Eilertsen, Eindhoven (NL)

(73) Assignee: AMS AG, Premstätten (AT)

( * ) Notice: Subject to any disclaimer, the term of this patent is extended or adjusted under 35 U.S.C. 154(b) by 857 days.

(21) Appl. No.: 17/272,718

(22) PCT Filed: Sep. 2, 2019

(86) PCT No.: PCT/EP2019/073348
§ 371 (c)(1),
(2) Date: Mar. 2, 2021

(87) PCT Pub. No.: WO2020/048921
PCT Pub. Date: Mar. 12, 2020

(65) Prior Publication Data
US 2021/0373132 A1   Dec. 2, 2021

(30) Foreign Application Priority Data
Sep. 4, 2018   (EP) ..................................... 18192541

(51) Int. Cl.
*G01S 7/481*   (2006.01)
*G01S 17/08*   (2006.01)
(Continued)

(52) U.S. Cl.
CPC ............ *G01S 7/4813* (2013.01); *G01S 17/08* (2013.01); *H01L 31/0203* (2013.01);
(Continued)

(58) Field of Classification Search
CPC ........ G01S 7/4813; G01S 17/08; G01S 17/04; H01L 31/0203; H01L 31/02164;
(Continued)

(56) References Cited

U.S. PATENT DOCUMENTS 8,604,436 B1 *  12/2013  Patel .................... H03K 17/941
250/338.1
8,779,361 B2   7/2014   Costello et al.
(Continued)

FOREIGN PATENT DOCUMENTS

EP   2881753 A1   6/2015
EP   3255456 A1   12/2017
(Continued)

OTHER PUBLICATIONS

European Exam Report in corresponding EP Application No. 18192541.3 mailed on Mar. 3, 2022, 4 pages.
(Continued)

*Primary Examiner* — Thanh Luu
*Assistant Examiner* — Monica T Taba
(74) *Attorney, Agent, or Firm* — MH2 Technology Law Group LLP (57) ABSTRACT

A method of manufacturing an optical sensor arrangement including the steps of providing a substrate having a surface and providing an integrated circuit comprising an optical detector arranged for detecting light of a desired wavelength range. The integrated circuit and a light emitter are mounted onto the surface, wherein the light emitter is arranged for emitting light in the desired wavelength range. The integrated circuit and the light emitter are electrically connected to each other and to the substrate. A light barrier is formed between the optical detector and the light emitter by dispensing a first optically opaque material along a profile of the integrated circuit. A mold layer is formed by at least
(Continued)

partly encapsulating the substrate, the integrated circuit and the light emitter with an optically transparent material. A casing, made from a second optically opaque material, is mounted on the light barrier and thereby encloses a hollow space between the casing and the mold layer.

12 Claims, 6 Drawing Sheets (51) Int. Cl.
  *H01L 31/0203* (2014.01)
  *H01L 31/0216* (2014.01)
  *H01L 31/0232* (2014.01)
  *H01L 31/173* (2006.01)
  *H01L 31/18* (2006.01)

(52) U.S. Cl.
  CPC .. *H01L 31/02164* (2013.01); *H01L 31/02325* (2013.01); *H01L 31/173* (2013.01); *H01L 31/18* (2013.01)

(58) Field of Classification Search
  CPC . H01L 31/02325; H01L 31/173; H01L 31/18; H01L 25/167; H01L 31/02327
  See application file for complete search history.

(56) References Cited

U.S. PATENT DOCUMENTS

| | | |
|---|---|---|
| 2010/0258710 A1 | 10/2010 | Wiese et al. |
| 2011/0310410 A1 | 12/2011 | Shimomura |
| 2012/0133956 A1 | 5/2012 | Findlay et al. |
| 2013/0079068 A1 | 3/2013 | Coffy et al. |
| 2013/0194388 A1 | 8/2013 | Busse |
| 2016/0025855 A1 | 1/2016 | Camarri et al. |
| 2016/0126403 A1* | 5/2016 | Tu .................. H01L 31/173 257/82 |
| 2016/0146639 A1* | 5/2016 | Chan ................ H03K 17/945 29/428 |
| 2017/0090018 A1 | 3/2017 | Buettgen et al. |
| 2017/0123064 A1 | 5/2017 | Luan |
| 2017/0141241 A1* | 5/2017 | Yu .................. G01J 1/0295 |
| 2017/0229505 A1* | 8/2017 | Gubser ............ H01L 27/14618 |
| 2018/0062003 A1 | 3/2018 | Luan et al. |
| 2018/0167602 A1 | 6/2018 | Pacala et al. |

FOREIGN PATENT DOCUMENTS

| | | |
|---|---|---|
| EP | 3290950 A1 | 3/2018 |
| EP | 3355075 A1 | 8/2018 |
| GB | 2486000 A | 6/2012 |
| GB | 2505675 A | 3/2014 |
| JP | 10267647 A * | 10/1998 |
| KR | 1020160132962 A | 3/2015 |
| KR | 1020180024588 A | 3/2018 |
| WO | 2015136099 A2 | 9/2015 |
| WO | 2017142487 A1 | 8/2017 |

OTHER PUBLICATIONS

Chinese Office Action issued is corresponding Chinese Patent Application No. 201980057377.1 dated Aug. 28, 2023, 13 pages, with English translation.

Chinese Office Action issued is corresponding Chinese Patent Application No. 201980057377.1 dated May 25, 2023, 17 pages.

* cited by examiner

OPTICAL SENSOR ARRANGEMENT, DEVICE AND METHOD OF MANUFACTURING AN OPTICAL SENSOR ARRANGEMENT

CROSS REFERENCE TO RELATED APPLICATIONS

The present application is the national stage entry of International Patent Application No. PCT/EP2019/073348, filed on Sep. 2, 2019, which claims the benefit of priority of European Patent Application No. 18192541.3, filed on Sep. 4, 2018, all of which are hereby incorporated by reference in their entirety for all purposes.

FIELD

This disclosure relates to a method of manufacturing an optical sensor arrangement, to an optical sensor arrangement and to a device comprising the optical sensor arrangement. For example, the device comprises the optical sensor arrangement arranged as a proximity sensor module or arranged as a time-of-flight sensor module.

Electronic devices, such as mobile phones, tablets, displays, and portable computers, comprise a growing number of sensors such as proximity sensors, time-of-flight sensors, ambient light sensors, color sensors or gesture sensors. Sensor packages are specifically designed to accommodate one or more light sensors and provide highly sophisticated sensor modules. Depending on the application and number of sensor components optical sensor packages can be quite complex and, thus, expensive to manufacture. This is true for proximity and time-of-flight sensors which rely on a dedicated optical design built into their optical packages, for example.

For example, a direct time-of-flight, TOF, sensor based distance measurement employs measuring the time duration between two events, such as when a series of light pulses leaves the range finder, gets reflected by an external object and when it is eventually received by the TOF sensor. The time duration between these two events, i.e. emission and detection, is directly proportional to the distance of the external object. Obviously, the precision of the distance measurement is directly proportional to the precision of the time measurement. A commonly applied method to improve accuracy is to provide an optical reference path between the emitter and the receiver, instead of relying on an electronic signal for starting a timer. In state-of-the-art integrated systems a vertical cavity surface emitting laser, VCSEL, is used as an emitter and two single photon avalanche diode, SPAD, arrays integrated on a single die serve as detectors for a measurement signal and a reference signal. In order to differentiate between reference and measurement signals, the two SPAD arrays are optically isolated. Thus, one array only receives the signal from the external target and the other array only detects the signal coming directly from the VCSEL.

Current packaging solutions often rely on an optical light barrier between the measurement SPAD array and the reference SPAD array. Such a barrier is especially difficult to manufacture because it often requires an optically leak-proof seal over an uneven surface covering the edges of the die. There have been attempts using a frame and barrier which are glued to a substrate. Lenses may be integrated in a cover lid. Due to the multitude of individual components, however, such structures are rather complex to manufacture and, thus, expensive.

It is to be understood that any feature described hereinafter in relation to any one embodiment may be used alone, or in combination with other features described hereinafter, and may also be used in combination with one or more features of any other of the embodiments, or any combination of any other of the embodiments, unless explicitly described as an alternative. Furthermore, equivalents and modifications not described below may also be employed without departing from the scope of the optical sensor arrangement, device and the method of manufacturing an optical sensor arrangement as defined in the accompanying claims.

SUMMARY OF THE DISCLOSURE

A method of manufacturing the optical sensor arrangement comprises the following steps. First, a substrate having a surface, which may be a main surface, is provided. Furthermore, an integrated circuit is also provided. For example, the integrated circuit comprises an optical detector, for example a main optical detector or first optical detector, which is operable to detect the light of a wavelength range, for example a desired wavelength range. The integrated circuit and the light emitter are mounted onto the surface. The light emitter is operable to emit light in the wavelength range. Then, the integrated circuit and the light emitter are electrically connected to each other and to the substrate.

A light barrier is formed between the first optical detector and the light emitter. Forming the light barrier involves dispensing a first optically opaque material along the profile of the integrated circuit. Then, a mold layer is formed by encapsulating the substrate, the integrated circuit and the light emitter with an optically transparent material.

Finally, a casing is mounted on the light barrier and thereby encloses a hollow space between the casing and the mold layer. The casing is made from a second optically opaque material, i.e. opaque in the desired wavelength range.

The optical sensor arrangement can be designed as a proximity sensor or as a time-of-flight sensor, for example. The integrated circuit comprises the necessary sensor components for proximity or time-of-flight measurements. Typically, the integrated circuit is already prefabricated. The at least one light emitter is configured to emit in the desired wavelength range which may involve visible light of a single wavelength, such as a single laser emission line, several wavelengths or a continuous range of wavelengths, for example. However, the desired wavelength range may also lie in the infrared or UV spectrum.

The proposed combination of process steps may result in a cost efficient solution. For example, an integrated sensor as well as a light emitter, such as a VCSEL laser, can be completely covered and sealed by the optically transparent material, e.g. a mold compound. The mold layer can be flat or shaped arbitrarily, e.g. to guide light or create lenses to focus or de-focus light coming in or out of the package.

The materials used for the mold layer and light barrier can be directly applied onto the integrated circuit. This enables the use of transfer molding equipment and compounds, which may have a significant cost advantage over injection molding. Transfer molding of optical compounds is a production technique in optical sensor packaging. The integrated circuit and the light emitter, e.g. VCSEL, are encapsulated by a mold compound, for example, which protects these components from environmental exposure and improves the overall reliability. Depending on the product specification, the package may have lenses or flat surfaces, i.e. with the same silicon detector, different features can be enabled or disabled, such as single- vs. multi-zone detection, by changing the package. For example, as the casing is connected to the light barrier but encloses a hollow space between the casing and the mold layer a gap is created which allows to mechanically decouple the casing from the mold layer. This may lead to reduced thermomechanical stress and improved reliability of the optical sensor arrangement. At the same time the light barrier and casing optically isolate the first optical detector and the light emitter from each other which reduces crosstalk between emission and detection.

In some embodiments the light emitter comprises a plurality of light emitters, for example a plurality of LEDs, wherein different emitters of the plurality of emitters are configured to emit light of the same or different wavelengths. The individual emitters can be optimized for different ranges in proximity and/or time-of-flight detectors, and, thus, allows for single- vs. multi-zone detection.

In at least one embodiment the light detector comprises a single pixel photodiode, a multi-pixel photodiode such as an array of photodiodes or a multi-pixel photodiode with one or more filters attached. Instead, or in addition, a single single-photon avalanche diode, SPAD, or an array of SPADs can be used light detector. The number of light detector may improve detection accuracy, e.g. in time-of-flight applications a detection event can be attributed to a specific light detector. Detection accuracy may further benefit from high sensitivity to light (and IR, UV) of SPADs. Typically, proximity and time-of-flight applications may suffer from low light intensities or low signal-to-noise ratios. Thus, high sensitivity may translate into improved accuracy.

In at least one embodiment the integrated circuit is provided with a second optical detector, e.g. a reference optical detector. The second optical detector is arranged next to the first optical detector on or in the integrated circuit. The light barrier is then formed between the first and the second optical detector by dispensing the first optically opaque material along the profile of the integrated circuit. This design allows for time-of-flight applications. Thus, the proposed method is quite flexible and allows for easy adaptation of the optical package for various applications.

In various embodiments the light emitter comprises a laser diode, a surface emitting laser, a vertical cavity surface emitting laser, an infrared light emitting photodiode and/or to visual light emitting photodiode. Typically, the light transmitter is connected to the integrated circuit and may not be integrated in the integrated circuit. Thus, the emitter can be chosen from a variety of choices which may influence signal-to-noise ratio, e.g. in low light conditions. For example, laser diodes or surface emitting laser provide rather high intensity of emission in a comparably compact and cost efficient design.

In at least one embodiment the first opaque material comprises a mold compound or potting compound which is at least partly opaque in the desired wavelength range. The second opaque material comprises a mold compound which is at least partly opaque in the desired wavelength range. The optically transparent material comprises a mold compound which is at least partly transparent in the desired wavelength range. Mold and potting compounds can be treated in mold or casting processes. These processes allow for a high degree of freedom when implementing the light barrier, mold layer and casing. This way it is possible to adapt the optical properties of the package to its intended application, e.g. by creating inclined or flat portions in the mold layer to guide light in and out of the package or by creating dedicated optics for the light emitter and/or detector, respectively.

In at least one embodiment the first opaque material and the second opaque material are different compounds. For example, the first opaque material includes thermosetting plastics, silicone rubber gels or epoxy used in potting of electronics. Using different opaque materials may further improve thermomechanical stability of the optical sensor arrangement. For example, one material may be more flexible than the other such that mechanical stress can be compensation by a certain degree of elasticity between the connection of the light barrier and casing.

In at least one embodiment dispensing of the light barrier is carried out by directly dispensing the first optically opaque material on a common die surface using transfer molding. This allows to account for uneven surfaces, for example. Typically, the integrated circuit has a certain height and the light barrier extends from the level of the substrate, walls of the integrated circuit and continues along the common die surface. By directly dispensing the first optically opaque material the different levels can be circumvented.

In at least one embodiment the light barrier is dispensed along the profile of the integrated circuit. Furthermore, the light barrier is dispensed over an edge and sidewalls of the integrated circuit as well as onto the main surface of the substrate. For example, the profile may span along a center line of the integrated circuit or may be inclined at an angle.

In at least one embodiment the casing is formed using a mold tool. Using the mold tool, i.e. in a mold process, the casing is formed such that, when mounted to the light barrier, leaves a gap between the casing and mold layer. For example, the casing may only contact the light barrier and the substrate when mounted to the light barrier.

In at least one embodiment the casing is formed using the mold tool such that the casing comprises a continuous body of the opaque material having walls which frame an inner surface. The walls contact the main surface when the casing is mounted to the light barrier. Furthermore, an inner surface of the casing is separated into two sections by means of a protrusion. The protrusion contacts the light barrier when the casing is mounted to the light barrier.

This way the casing contacts the substrate, e.g. at a boundary area arranged around the integrated circuit, and the light barrier via the protrusion. These may be the only contact points or areas so that there is reduced mechanical coupling. At the same time, however, the casing provides seal from environmental influence, e.g. shields the optical arrangement from ambient light.

In at least one embodiment, after forming the mold layer, the optically transparent material is cured. After this curing step, optionally, an incision can be cut into the mold layer across the profile such that a surface of the previously dispensed light barrier is cleared from the first optically transparent material. For example, the cut is just deep enough to fully separate the optically transparent material, but only part of the previously dispensed opaque light barrier. The common die surface remains unharmed. The protrusion extends into the incision and contacts the surface when the casing is mounted on the light barrier. The protrusion complements the light barrier in the sense that both structures form a larger optical barrier which optically shields the light emitter and light detector. This way optical crosstalk is reduced. Furthermore, the incision can be cut with high precision so that the light barrier can be prepared to accommodate the protrusion with high precision.

In at least one embodiment the substrate comprises a boundary area on the main surface which encircles the integrated circuit. The casing is mounted to the boundary area. For example, the boundary area is chosen large enough to accommodate the walls of the casing. The boundary area serves as mechanical contact and support of the casing.

In at least one embodiment the incision is cut along the whole profile of the integrated circuit and continues over the main surface of the substrate until the boundary area on the substrate. The boundary area constitutes an area on the main surface of the substrate that encircles the integrated circuit. The incision is cut into a constant depth with respect to a surface, such as a surface of the mold layer or the main surface of the substrate. Said constant depth is chosen deep enough to clear the optically opaque transparent material or cut into the optically opaque transparent material such as to expose the first optically opaque material. For example, some material of the light barrier may be removed due to process limitations. Finally, the protrusion extends into the incision and contacts the surface when the casing is mounted on the light barrier to a level with the constant depth.

In at least one embodiment the mold layer is formed by a molding and/or casting process.

In at least one embodiment the molding and/or casting process involves arranging a first lens over the first or main optical detector. Alternatively, or in addition, a second lens is arranged over the light emitter. For example, the lenses are aligned such that their respective detectors or emitters are located in the optical field of view of the lenses. For example, the detectors are located in focal spots or focal planes of the lenses, respectively. The molding and/or casting process provides a cost efficient way to manufacture the lenses at wafer-level and directly into the mold layer. There is no need for externally attached optics.

Furthermore, mounting the casing involves arranging and aligning a first aperture with the first lens. Alternatively, or in addition, a second aperture is arranged and aligned with the second lens. The casing can be manufactured so that it comprises said apertures. This can be achieved in a molding process, for example. Thus, the apertures may not be in contact with the lenses, i.e. the lenses are mechanically decoupled from the casing.

Furthermore, the apertures in the casing can be made equal or smaller in diameter then the diameters of the lenses, respectively. For example, the apertures can have the shape of a truncated cone. A base surface may face the mold layer and a (smaller in area) top surface may face away from the mold layer (and casing). This additional degree in freedom allows for coming up with aperture sizes that lead a larger amount of incident light through the lenses. Reduced loss of light may improve optical performance of the optical sensor arrangement.

In at least one embodiment an optically functional coating is applied to the surface of the mold layer. Alternatively, or in addition, optically functional additives are mixed into the optically transparent material for forming the mold layer. The additives may include dyes, fluorescent or non-fluorescent nano-particles, quantum dots or light scattering particles such as titanium oxide particles. Furthermore, the transparent material such as silicone can be transparent in the visual and near infrared range. But using other types of polymers may have optical function in the desired wavelength range such as selective transmission. Optically functional coatings or additives allows for altering the optical properties of the sensor arrangement, e.g. they may function as an optical filter.

In at least one embodiment a cover layer is arranged on the casing. The cover layer can also be arranged with an additional optical filter of optical filter coating on the surface. Alternatively, or in addition, glass slides are precut to appropriate pieces and are attached to the light emitter, to the first and second optical detectors, e.g. optical main or reference detectors, before forming the mold layer. The cover layer or glass slides may seal the optical sensor arrangement from environmental influence. For example, the cover layer or glass slides may be comprised by the optical sensor arrangement as individual components or be part of a larger device such as a mobile phone, tablet, etc.

In at least one embodiment a plurality of optical arrangements are manufactured at an array level and are finally singulated into individual optical sensor arrangements. The proposed method of manufacturing an optical sensor arrangement can be carried out at a single device level. However, the method can be applied to wafer-level so that a plurality of devices can be manufactured in parallel.

In at least one embodiment an optical sensor arrangement comprises a substrate having a surface, e.g. main surface. An integrated circuit comprises an optical detector, e.g. a main or first optical detector, which is operable to detect light of the desired wavelength range. For example, the integrated circuit and a light emitter are mounted onto the surface. The light emitter is operable to emit light in the desired wavelength range. Furthermore, the integrated circuit and the light emitter are electrically connected to each other and to the substrate.

A light barrier is formed between the first optical detector and light emitter and comprises a first optically opaque material arranged or disposed along a profile of the integrated circuit. A mold layer at least partly encapsulates the substrate, the integrated circuit and the light emitter with an optically transparent material. Finally, a casing is mounted to the light barrier and encloses a hollow space between the casing and the mold layer. The casing is made from a second optically opaque material. For example, the casing is glued to the mold layer.

In at least one embodiment the hollow space comprises at least one gap between the casing and the mold layer. The hollow space as a gap can be carried out in different designs which should be considered limiting. For example, the gap may have no contact points other than the light barrier or a boundary area on the substrate. In a certain sense the gap extends on interrupted between the mold layer and casing.

In other embodiments the gap may be interrupted by one or more contact points, contact areas and/or filler materials, such as glue or intermediate layers of elastic material. Depending on the design of the gap mechanical decoupling of the casing and mold layer can be established in many different optical sensor designs.

In at least one embodiment the at least partly filled with the filler material. The filler material has a material property that does not prevent mechanical decoupling on the casing and mold layer or may even support the decoupling.

For example, the filler material may be applied, molded, potted or coated on the mold layer in an intermediate step. The filler material may include a glue or adhesive, polymer or potting material, for example. Furthermore, the filler material may be a stress-decoupling elastomeric material filling the gap at least partly or completely. In addition, the filler material may further be operable as a spectral filter. This can be achieved by means of the material itself, e.g. due the optical properties such as spectral transmission characteristic of the material, or by addition of filler particles such as nano particles, quantum dots or dye molecules having a desired transmission characteristic. This way a higher degree of design freedom can be achieved while preserving the mechanical decoupling properties. In addition, further functionality can be attributed to the filler material.

In at least one embodiment the casing comprises a continuous body of the opaque material. The continuous body comprises walls which contact the main surface. An inner surface is separated into two sections by means of a protrusion, wherein the protrusion contacts the light barrier. In this embodiment the casing contacts the substrate, e.g. at a boundary area arranged around the integrated circuit, and the light barrier via the protrusion. These may be the only contact points or areas so that there is reduced mechanical coupling. At the same time, however, the casing seals from environmental influence, e.g. shields the optical arrangement from ambient light.

In at least one embodiment the mold layer comprises an incision which is cut into the mold layer across the profile of the integrated circuit such that the surface of the light barrier is cleared from the first optically opaque material. The protrusion extends into the incision and contacts the surface with the casing mounted on the light barrier.

The protrusion complements the light barrier in the sense that both structures form a larger optical barrier which optically shields the light emitter and light detector. This way optical crosstalk is reduced. Furthermore, the incision can be cut with high precision so that the light barrier can be prepared to accommodate the protrusion with high precision.

In some embodiments the protrusion of the casing fits into the incision of the mold layer. For example, the incision and the light barrier may have the same height and width such that the barrier width fits into the width of the incision. In some embodiments these widths may leave a certain gap which can be filled with the filler materials. In a certain sense the hollow space or gap is interrupted at or around the light barrier. In yet other embodiments the incision and the light barrier may have different height and width such that the barrier leaves a gap with respect to the incision.

In at least one embodiment the substrate comprises a boundary area on the main surface. The boundary area encircles the integrated circuit and the casing is mounted to the boundary area. For example, the boundary area accommodates the walls of the casing. The boundary area serves as mechanical contact and support of the casing and effectively seals the optical sensor arrangement from its environment.

In at least one embodiment the mold layer comprises a first lens located over the main detector and/or a second lens located over the light emitter. The lenses are arranged in the optically transparent material. Furthermore, the casing comprises a first aperture which is aligned with the first lens and/or comprises a second aperture which is aligned with the second lens.

For example, the components of the optical sensor arrangement, e.g. the first and second detectors and light emitter can be located in focal spots or focal planes of the lenses, respectively. The lenses can be directly arranged into the mold layer. There is no need for externally attached optics. Mechanical decoupling and, thus, thermomechanical stability extends to the arrangement of lenses and apertures. This may improve accuracy and reliability of the optical sensor arrangement.

The optical sensor arrangement can be designed as a proximity sensor, for example and then the integrated circuit comprises the necessary sensor components to collect proximity signals for proximity measurements. The at least one light emitter is configured to emit in the desired wavelength range which may involve visible light of a single wavelength, such as a single laser emission line, several wavelengths or a continuous range of wavelengths, for example. However, the desired wavelength range may also lie in the infrared or UV spectrum.

The casing is connected to the light barrier but encloses a hollow space between the casing and the mold layer such that a gap is created which allows to mechanically decouple the casing from the mold layer. This may lead to reduced thermomechanical stress and improved reliability of the optical sensor arrangement. At the same time the light barrier and casing optically isolate the first optical detector and the light emitter from each other which reduces crosstalk between emission and detection.

In at least one embodiment the integrated circuit comprises a second optical detector, e.g. reference optical detector, arranged next to the first optical detector on or in the integrated circuit. The light barrier is formed between the first and the second optical detector and along the profile of the integrated circuit. The optical sensor arrangement can be designed as a time-of-flight sensor, for example, and the integrated circuit then comprises the necessary sensor components for collecting time-of-flight signals for time-of-flight measurements, i.e. the reference detector, for instance.

In at least one embodiment a device comprises at least one optical sensor arrangement according to the aspects discussed above, wherein the optical sensor arrangement is arranged as a proximity detector. Furthermore, the device comprises a host system wherein the at least one optical sensor arrangement is embedded or integrated in. The host system comprises one of a mobile device, a display, lighting system, camera with autofocus system or any other host system which uses information on the presence of nearby objects without any physical contact.

For example, the mobile device can be a mobile phone, Smartphone, computer, wearable, smartwatch, tablet or the like. The optical sensor arrangement can be implemented into the mobile device. In some embodiments the optical sensor arrangement comprises internal electronics for its operation such as a microprocessor or state machine, or the like. In other embodiments, however, the device provides electronics to operate the sensor device.

In at least one embodiment the device comprises an optical sensor arrangement which is arranged as arranged as a time-of-flight sensor.

The host system comprises one of a mobile device, a 3D-camera, or a spectrometer, or any system that uses distance information. For example, a 3D-camera as host system comprises a time-of-flight, TOF, camera and is arranged for 3D imaging. Typically, such as system comprises an illumination unit such as a photodiode or laser diode. One example illumination unit comprises a Vertical Cavity Surface Emitting Laser, VCSEL, to illuminate an external object. Typically the illumination unit emits modulated light with high speeds up to some 100 MHz. Alternatively, a single pulse per frame such as 30 Hz can be used. The light emitter of the optical sensor arrangement can be used as illumination unit or contribute to the illumination unit.

The optical sensor arrangement can be used to determine a time-of-flight to the external object, for example, the light detector can be read out and provide sensor signal which is a direct measure of the time the light has taken to travel from the illumination unit to the object and back to the array. The host system, e.g. an imaging device, comprising the optical sensor arrangement comprises driver electronics to control the illumination unit and the optical sensor arrangement. Furthermore, the optical sensor arrangement may have an interface in order to communicate with the host system. In a 3D-camera imaging system two types of images may be generated: a regular 2D image and an additional 1D image with distance information. These two images can be combined to yield a 3D image.

Further implementations of the optical sensor arrangement and device are readily derived from the various implementations and embodiments of the method of manufacturing an optical sensor arrangement and vice versa.

In the following, the concept presented above is described in further detail with respect to drawings, in which example embodiments are presented.

In the example embodiments and Figures below, similar or identical elements may each be provided with the same reference numerals. The elements illustrated in the drawings and their size relationships among one another, however, should not be regarded as true to scale. Rather individual elements, such as layers, components, and regions, may be exaggerated to enable better illustration or improved understanding.

DETAILED DESCRIPTION

Figures 1A, 1B:
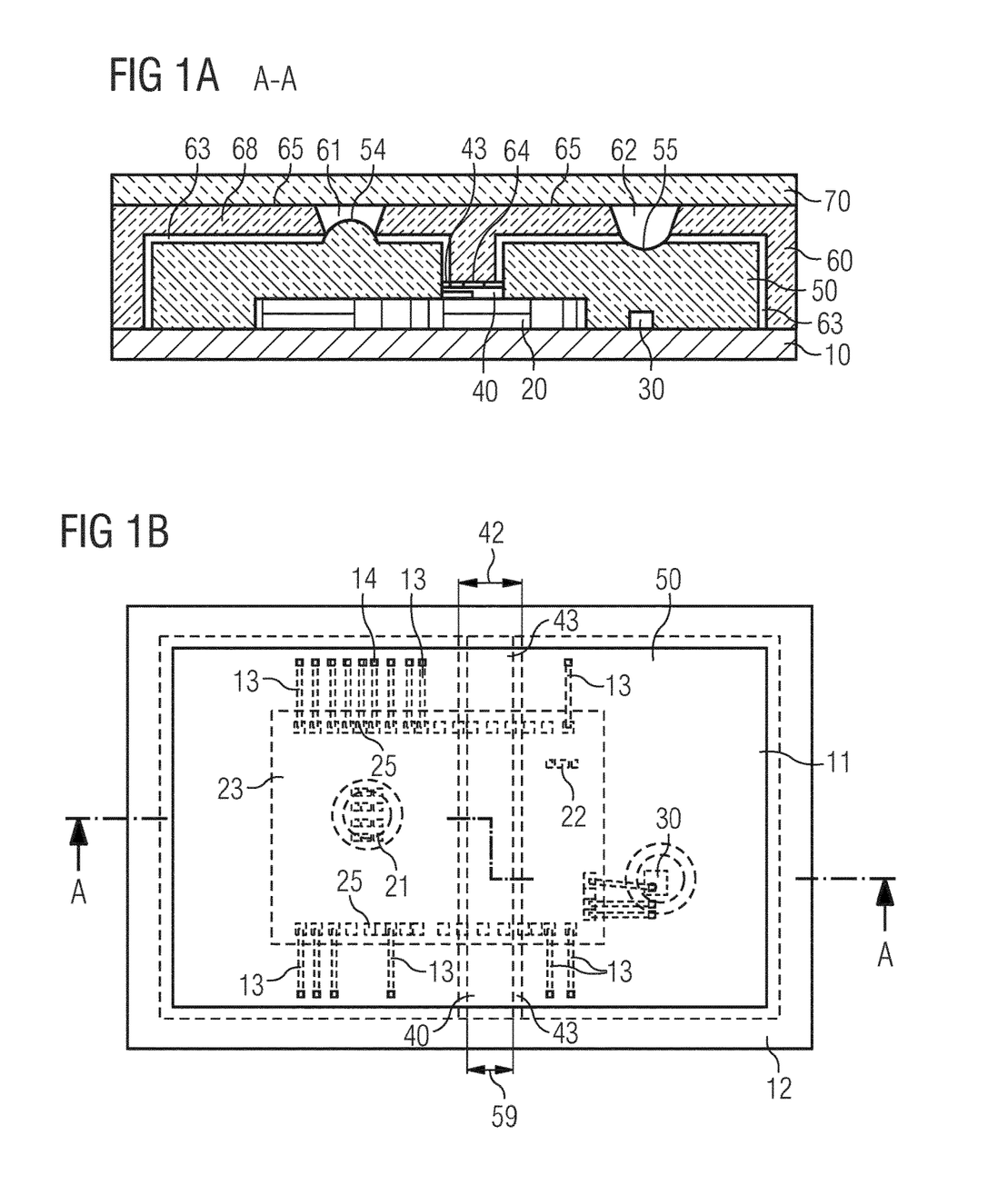
FIGS. 1A, 1B show an example optical sensor arrangement from different perspectives.

FIGS. 1A and 1B show an example optical sensor arrangement viewed from different perspectives. FIG. 1A shows a sectional view and FIG. 1B shows a top view of the optical sensor arrangement described below. A section is indicated by A-A. The optical sensor arrangement comprises a substrate 10, an integrated circuit 20, a light emitter 30, a light barrier 40, a mold layer 50, a casing 60 and a glass cover 70.

The substrate 10 serves as carrier to mechanically support and electrically connect the components of the optical sensor arrangement, e.g. by providing conductive tracks, pads and other features. For example, the substrate 10 comprises a printed circuit board, PCB, and provides electrical connectivity of pads to package leads on a bottom side of the substrate 10 (not shown), for example. Electrical connections such as wire bonds 13, or through silicon vias, electrically connect the integrated circuit 20 with the substrate 10, e.g. the backside of the substrate 10. FIG. 1B shows that the integrated circuit 20 comprises a number of terminals or pads 25 which, by means of the wire bonds 13, are electrically connected to the pads 14 on the substrate 10.

The integrated circuit 20 is arranged on a main surface 11 of the substrate 10. In this example embodiment the optical sensor arrangement is configured as a time-of-flight sensor and the integrated circuit 20 comprises a first optical detector, e.g. main optical detector 21 and a second optical detector, e.g. reference optical detector 22 which are commonly arranged in or on the die of the integrated circuit 20. The optical detectors 21, 22 could be implemented as single photodiodes, respectively, e.g. as infrared sensitive photodiodes, or as arrays of several such photodiodes. Alternatively, the optical detectors 21, 22 could be implemented as single-photon avalanche diodes (SPADs) or as arrays of SPADs.

Furthermore, the integrated circuit 20 comprises additional components, such as control logic, analog components and/or electrical connections. Examples include analog-to-digital converters, microprocessors, light-to-digital (LTD), light-to-voltage (LTV) and light-to-frequency (LTF) components, driver units and interfaces. These components may all, or at least some of them, be integrated into the same integrated circuit or are attached to the integrated circuit 20 via respective terminals.

The section A-A illustrated in FIG. 1A is marked for easy reference. It should be noted that the main and reference optical detectors 21, 22 do not necessarily have to reside on a center line of the integrated circuit 20 but can be offset as depicted in FIG. 1B.

In this example embodiment the light emitter 30 comprises a VCSEL laser diode. VCSEL laser diodes predominantly emit in the infrared or visual band. The light emitter 30 (or VCSEL) is also mounted on the main surface 11 of the substrate 10 but not on or in the integrated circuit 20. Wire bonds 13 or other electrical connections such as TSV establish electrical connection to the integrated circuit 20. The integrated circuit 20 comprises a driver unit to drive and operate the emitter 30 (or VCSEL), for example. In other alternative embodiments the light emitter 30 could also be part of the integrated circuit 20, i.e. an integral component of the integrated circuit, for example, by means of a CMOS process.

The light barrier 40 is arranged over a common die surface 23 and along a profile of the integrated circuit 20 (see FIG. 1B). With respect to section A-A indicated in the drawings the light barrier 40 is placed between the main optical detector 21 on one side and the reference optical detector 22 at the other side. The light emitter 30, which may not be located in the integrated circuit 20, is also separated from the main optical detector 21 by means of the light barrier 40. The light barrier 40 has a certain barrier height 41 and barrier width 42 as shown in FIG. 2B.

The light barrier 40 comprises an optically opaque material, such as a potting or a mold material. The term "optically opaque" is defined in terms of the emission characteristics of the light emitter 30 and/or ambient light. For example, opaque in this context refers to the fact that the optically opaque material absorbs most, if not all, of certain wavelengths of light which are emitted by the light emitter 30, e.g. a VCSEL laser diode, or is incident from the outside of the package as ambient light. However, opaque materials may show transmission of light to a certain degree. Furthermore, there could be other spectral windows of larger transmission as well. The material of the light barrier 40 has the effect to optically isolate the main optical detector 21 from the emission of the light emitter 30. In general, the material of the light barrier 40 can be different from the material of the casing 60. For example, the material can be a potting material while the casing 60 comprises a mold compound.

The mold layer 50 encapsulates the integrated circuit 20 and the light emitter 30. In fact, the integrated circuit 20 and the light emitter 30 are embedded, and thereby sealed, in optically transparent mold material. In fact, the mold layer 50 comprises an optically transparent material or compound such as a clear mold. The compound is at least partly transparent to one or more wavelengths of light emitted by the light emitter 30 (e.g. a VCSEL). The mold layer 50 comprises a first and second lens 54, 55 which are arranged in the optically transparent material, e.g. by means of a molding process. The first lens 54 is arranged over the main optical detector 21 and the second lens 55 is arranged over the reference optical detector 22. For example, the lenses are aligned with their respective detectors such that the detectors are located in the optical field of view of the lenses. For example, the detectors are located in focal spots or focal planes of the lenses, respectively.

The substrate 10 is at least partly covered by the mold layer 50. In the embodiment shown in FIGS. 1A and 1B there remains a boundary area 12 which, instead of being covered by the mold layer 50, is mounted to the casing 60. Furthermore, the mold layer 50 comprises an incision 51 which spans along the light barrier 40. In fact, the incision 51 spans along the whole profile 24 of the integrated circuit 20 and continues over the main surface 11 of the substrate 10 until the boundary area 12. In a certain sense the light barrier 40 and the incision 51 bridge over the integrated circuit 20. This is not to say that the incision 51 and the light barrier 40 necessarily have the same height and width. In fact, in this embodiment the barrier width 42 is bigger than a width 59 of the incision 51. This way the light barrier 40 allows to bridge the uneven profile 24 in a cost efficient manner.

The casing 60 is arranged over the mold layer 50. In fact, the casing 60 may be pre-formed from optically opaque material, e.g. in a mold process. The casing 60 encapsulates the mold layer 50 but does not contact external walls 58 and surfaces 53 of the mold layer 50. A gap 63 remains between the casing 60 and the mold layer 50. In this sense the casing 60 encapsulates a hollow space which is confined by the casing 60 itself and the mold layer 50. In this example embodiment the casing 60 confines the whole mold layer 50 except for apertures arranged over the lenses 54, 55. For example, a first aperture 61 is arranged and aligned with the first lens 54. A second aperture 62 is arranged and aligned with the second lens 55. In this embodiment, the apertures are also not in contact with the mold layer, and e.g. open to ambient air.

The casing 60, however, is mounted on the incision 51, and, thus, is connected to and in contact with the light barrier 40 except for a contact area 43. The contact area 43 is not in contact with the mold layer 50 either. Rather the gap 63 established between the mold layer 50 and casing 60 continues towards the contact area 43. The casing 60, however, comprises a protrusion 64 that extends from an inner surface 65 towards the light barrier 40 while keeping the gap 63. The protrusion 64 is designed to fit into the incision 51. A width 66 of the protrusion is arranged to leave the gap 63 when mounted on the light barrier 40. A height 67 of the protrusion is arranged such that the casing is in contact with the light barrier 40 when mounted on the substrate 10, i.e. mounted on the boundary area 12. In this example embodiment the casing is only in mechanical contact with the boundary area 12 and light barrier 40.

The glass cover 70 is attached to an outer surface 61 of the casing 60. The glass cover 70 is at least transparent in the desired wavelengths range.

It should be noted that the lenses, apertures and the glass cover are optional components which are not necessary for implementing the optical sensor arrangement. They could be provided if deemed to improve a given application.

The casing 60 has the effect to shield the optical sensor arrangement from ambient light and also block emission from the light emitter 30 to leak out the optical package. This is due to the optically opaque material and contact between the boundary area 12 and light barrier 40. In fact, the protrusion 64 complements the light barrier 40. For example, the protrusion extends the height 41 of the light barrier 40.

In this example embodiment, the casing 60 is only connected to the boundary area 12 of substrate 10 and to the light barrier 40. This creates the gap 63 which to a larger degree mechanically decouples the casing 60 from the mold layer 50. In other embodiments the casing 60 may be connected to portions of the mold layer 50 or to the light barrier 40 only.

This leads to reduced thermomechanical stress and improved reliability of the optical sensor arrangement. For example, consider lenses 54, 55 designed into the mold layer 50. These lenses too are decoupled from the casing 60. As a consequence optical alignment of the lenses are only effected to a reduced degree, if at all, by changes in ambient temperature or mechanical stress acting on the casing. Keeping optical alignment even under external influences preserves or improves accuracy and reliability of the optical sensor arrangement. This may especially be true for time-of-flight applications which rely on accurate time measurement or alignment of regular 2D images and 1D depth images, for example.

Furthermore, the apertures 61, 62 in the casing 60 can be made equal or smaller in diameter then the diameters of the lenses 54, 55, respectively. For example, the apertures can have the shape of a truncated cone. A base surface may face the mold layer 50 and a (smaller in area) top surface may face away from the mold layer (and casing). This additional degree in freedom allows for design of aperture sizes that guide a larger amount of incident light through the lenses. Reduced loss of light may improve signal to noise ratio and, thus, optical performance of the optical sensor arrangement.

FIGS. 2A to 2F show an example method for manufacturing an optical sensor arrangement. The method for manufacturing an optical sensor arrangement, or packaging process, is usually done on an array or wafer level such that multiple devices can be processed in parallel and at a time. In the following, however, the process is illustrated only for a single unit. The steps can be applied at the array level analogously.

Figure 2A:
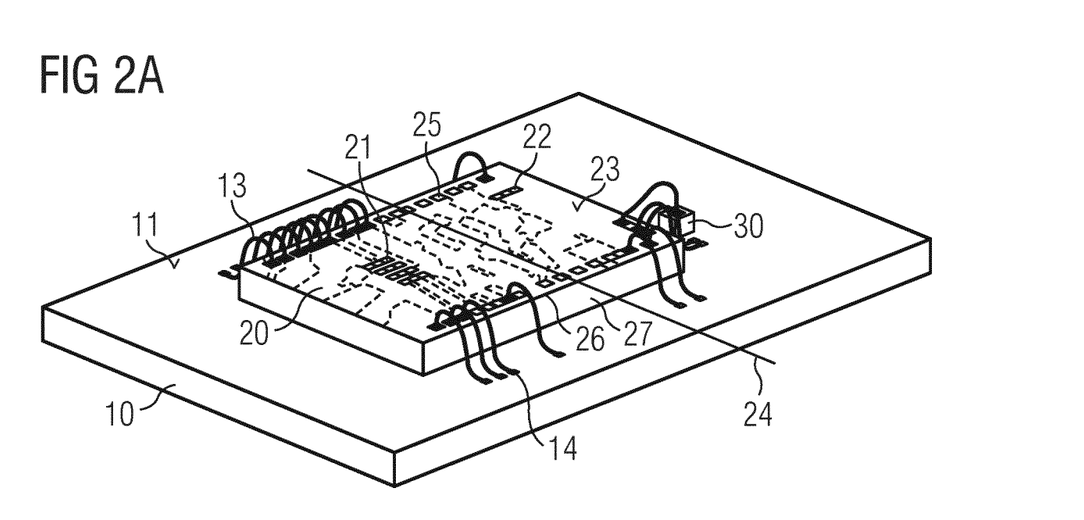
FIGS. 2A to 2F show an example method for manufacturing an optical sensor arrangement.
Figure 2B:
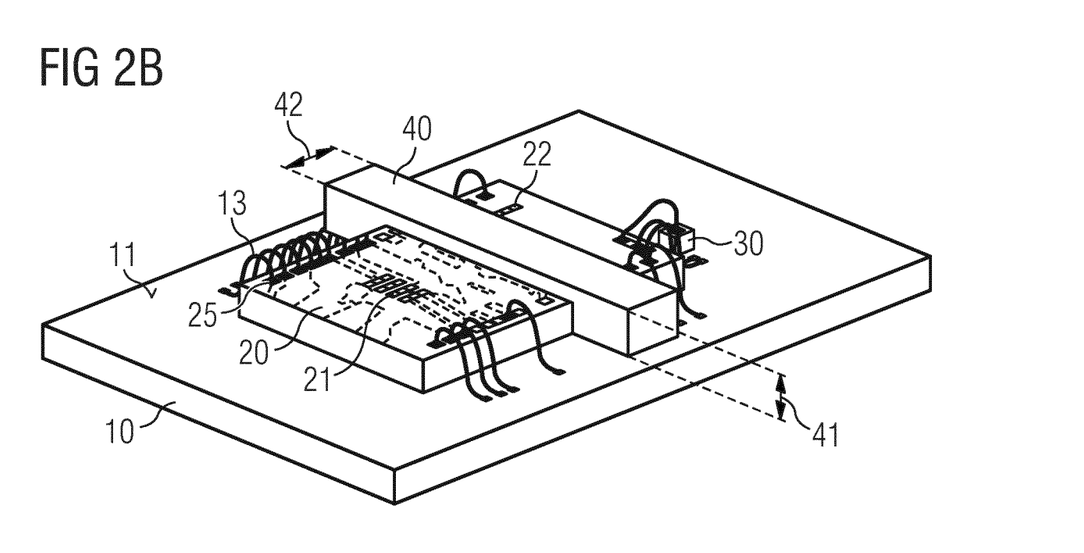

FIG. 2A illustrates a first step of the packaging process flow. The integrated circuit 20 and the light emitter 30, e.g. VCSEL, are attached to the substrate 10, e.g. a printed circuit board (PCB), and the electrical connections are established by the wire bonds 13 between the terminals 25, e.g. top bond pads, to dedicated pads 14 on the main surface 11 of the substrate 10. Typically, the integrated circuit 20 is manufactured separately and only needs to be mounted on and electrically connected to the substrate 10.

FIG. 2B shows the next step in the process flow. A light-blocking potting material, e.g. a black, infrared (IR)-absorbing potting material, is dispensed along a profile 24 of the integrated circuit, e.g. by applying the material over the common die surface 23 and over an edge 26 and sidewalls 27 of the integrated circuit 20 as well as onto the main surface 11 of the substrate 10. The light-blocking potting material is cured and forms the light barrier 40 between the two optical detectors 21, 22, e.g. photodiode or SPAD arrays. For example, the light-blocking potting material is directly applied or dispensed by means of transfer molding.

The resulting light barrier 40 has a barrier width 42 which, within process parameters, essentially is constant along the profile 24. However, the barrier height 41 typically varies along the profile 24. For example, an absolute height with respect to the main surface is, within process parameters, essentially constant, i.e. the light barrier 40 is thinner in its parts arranged over the integrated circuit 20 and somewhat thicker at the end portions arranged over the substrate, i.e. outside the integrated circuit 20. In a certain sense, the light barrier 40 bridges over the integrated circuit 20 and has a shape similar to a clamp or a bridge. However, this special geometry should not be considered limiting as other profiles could be implemented as well. The geometry and shape of the light barrier 40 can be precisely controlled by means of transfer molding technology. The flexible geometry and shape of the light barrier 40 allows for accounting for uneven surfaces, e.g. due to the integrated circuit, in a cost efficient manner.

Figure 2C:
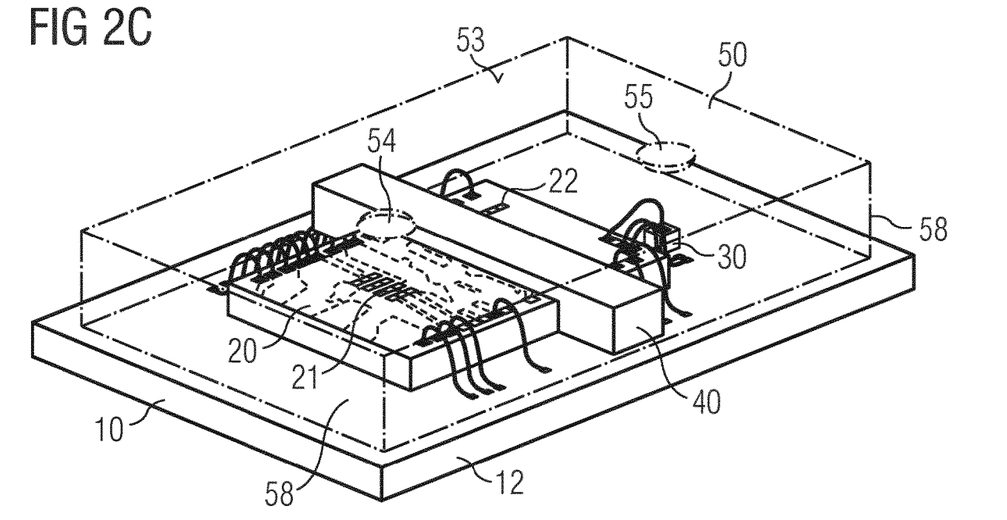

FIG. 2C shows a next step in the process flow involving molding or casting of clear compound and incision of side walls. First, the optical sensor or array of optical sensors is covered by a mold compound to form the mold layer 50. The mold compound is at least transparent to the wavelength (or range of wavelengths) of light emitted by the light emitter 30, e.g. the VCSEL. It can also be fully transparent to visible light and infrared (IR) or dyed/colored to modify the transmission characteristics.

Suitable processes to achieve that are e.g. casting or molding, where the latter allows the integration of surface features, such as lenses, diffusing (matte/rough/frosted) surfaces or open cavities in further process steps. As discussed above with respect to FIGS. 1A and 1B the mold layer 50 encapsulates the complete integrated circuit 20 and the light emitter 30, i.e. the integrated circuit 20 and the light emitter 30 are embedded in the optically transparent material. The first and second lens 54, 55 can be arranged into the optically transparent material by means of a molding process, e.g. using mold tools that have lens shape at the respective positions.

Optionally, optically functional coatings, such as optical filters (organic or interference based), can be applied to the mold layer 50 or be included into the optically transparent material, e.g. the clear compound. The material or surface of the mold layer 50 thus may have the effect to selectively block light from reaching the main and/or reference optical detectors 21, 22 and prevent such light from interfering with the measurement.

Figure 2D:
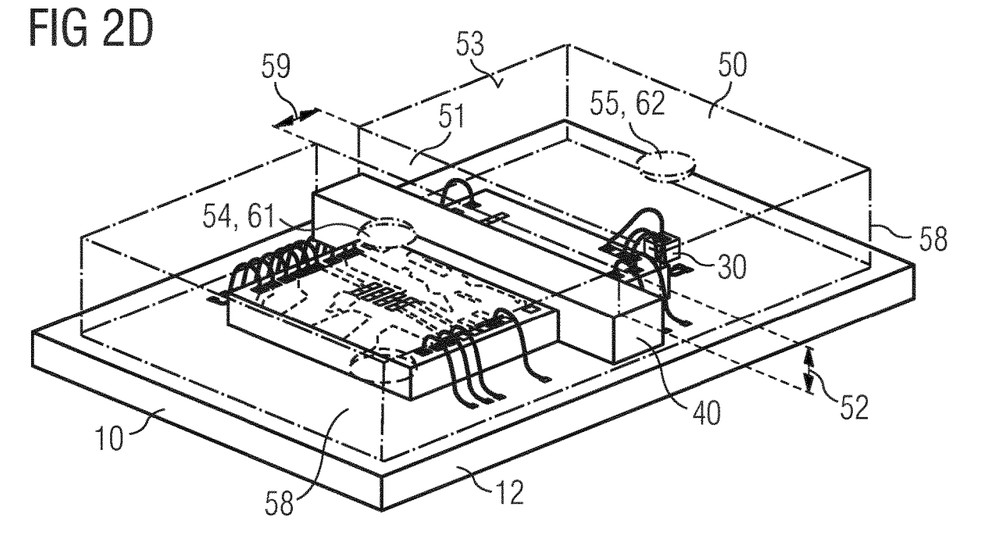

FIG. 2D relates to an incision of the light barrier 40. This step may be obsolete if the mold layer 50 can be applied to the substrate 10 leaving the boundary area 12 without material in the first place. This can be achieved using a mold tool. Typically, however, several optical sensor arrangements are manufactured in parallel, e.g. at wafer-level. Then, the mold layer 50 may be applied by molding the transparent material over the whole wafer. After drying or curing of the compound of the mold layer 50, four incisions are made, e.g. by dicing, to clear the boundary area 12 on the substrate 10, e.g. around each individual optical sensor arrangement. In both cases, as a result the substrate 10 is covered by the mold layer 50 but the boundary area 12 remains uncovered. Conductive traces on the printed circuit board are not harmed.

Another incision 51 or cut is made across the profile 24 of the previously dispensed light barrier 40. This cut is just deep enough to fully separate the clear compound, but only part or none of the previously dispensed light barrier 40. The common die surface 23 remains unharmed. For example, the incision 51 spans along the whole profile 24 of the integrated circuit 20 and continues over the main surface 11 of the substrate 10 until the boundary area 12. In some embodiments the barrier width 42 can be bigger than a width 59 of the incision 51. Thus, there can be a contact area 43 on the light barrier 40. However, the widths can be precisely controlled by means of the incision or cutting step.

Figure 2E:
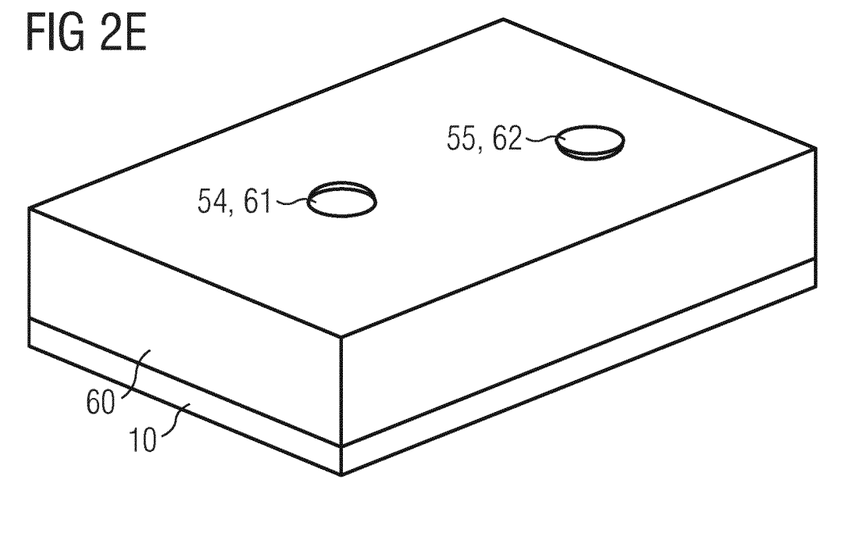

FIG. 2E relates to mounting the casing 60 to the substrate 10 and light barrier 40. The casing 60 can be formed in a separate process as will be discussed with respect to FIG. 3 below. In the mounting step, the casing 60 is arranged over the mold layer 50 and then is connected to the light barrier 40 and the boundary area 12 of the substrate 10. Connection may be established by gluing the casing 60.

The casing 60 is formed to fit into the incisions made at the boundary area 12 and the incision 51 over the light barrier 40 but at the same time leave a gap 63 between the casing 60 and the mold layer 50. When mounted, the casing 60 encapsulates the mold layer 50 and covers the whole external surface of the mold layer 50. Apertures 61, 62 can be arranged in the casing 60 and are aligned with lenses 54, 55 when the casing 60 is mounted to the boundary area 12 and into incision 51.

Figure 2F:
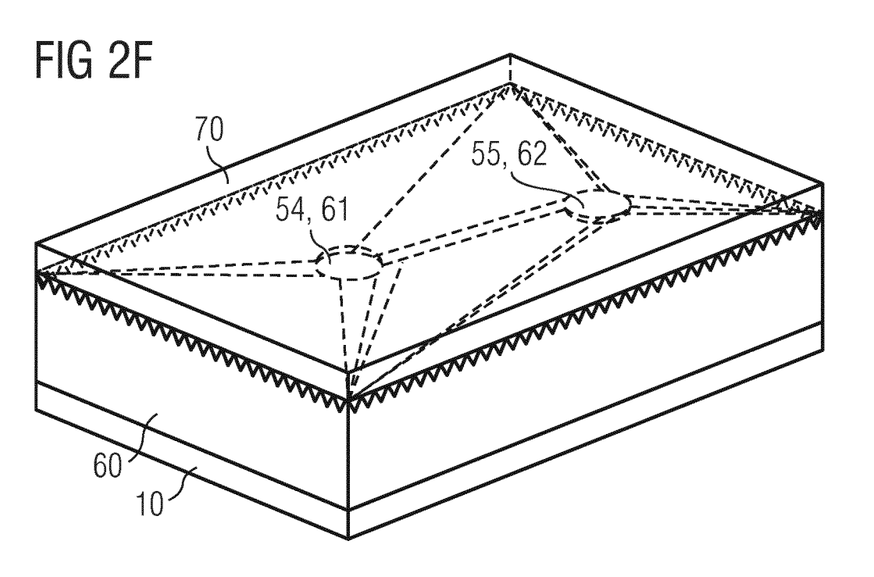

FIG. 2F shows an optional attachment of a cover layer, such as glass or plastic layer. The cover layer 70 can be attached to an outer surface 61 of the casing 60. At this stage, an additional glass cover 70 can be attached to the top of the single package shown in the drawing or the whole array of several optical sensor arrangement manufactured in parallel. The cover layer 70 may bear an additional optical filter, either by selective absorption/transmission or through an optical filter coating.

In an alternative embodiment instead of, or in addition to, the cover layer 70, glass slides are pre-cut to appropriate pieces and are attached directly to the light emitter 30, or detectors 21, 22 before the clear molding step.

Finally, the individual units on the array can be separated. The cut width of this singulation step is narrower than of the previous incisions, such that opaque material remains on the sidewalls of the package.

Figure 3:
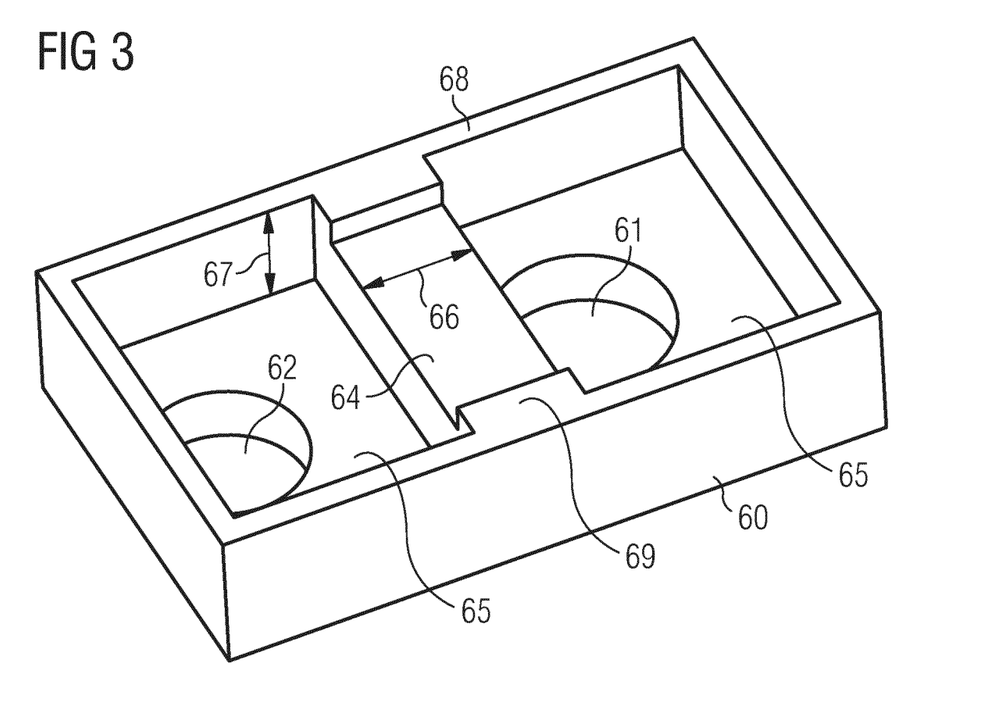
FIG. 3 shows an example casing.

FIG. 3 shows an example casing. The casing 60 can be pre-formed, e.g. in a molding procedure. For example, a mold tool having the inverse structure can be used to manufacture the casing 60, e.g. using transfer molding. The optically opaque material comprises a polymer which is easy to mold and manipulate, but upon curing, hardens into a permanent form, e.g. a thermoset polymer. Opaque in this context means that the material does not transmit (i.e. absorbs) all or certain wavelengths of light, e.g. which are emitted by the VCSEL, LED or incident from the outside of the package. Apertures 61, 62 can be manufactured using molding such as film assisted transfer molding, where the mold tool contains pins which push down on the clear mold and prevent the opaque mold material from flowing into this region.

The drawing shows the casing 60 viewed from an underside, i.e. the side which is to be mounted to the light barrier 40 and boundary area 12. The casing 60 comprises a body of continuous opaque material having walls 68. The walls 68 have a width that fits on the boundary area 12 when the casing 60 is mounted. Furthermore, the casing 60 comprises an inner surface 65 which is separated into two sections by means of a protrusion 64. In this embodiment each section comprises an aperture 61, 62 which is arranged into and advanced through the inner surface 65.

The protrusion 64 has a width 66 and height 67. Both width and height are arranged to fit to the light barrier 40. For example, when the casing 60 is mounted over the mold layer 50 the protrusion 64 contacts or rests on the light barrier 40. The width 66 is chosen such as to leave a gap 63 between the casing 60, e.g. the inner surface 65 and walls 68. The height 67 is chosen to contact the light barrier 40 when the casing 60 is mounted to the protrusion 64. This way in the mounted state the protrusion 64 complements the light barrier 40. Sections 69 somewhat broaden the walls 68 and extend into the interior of the casing. The sections 69 can be used to accommodate and connect the light barrier 40 to the walls 68 of the casing 60. Furthermore, sections 69 allow for compensating uneven surfaces defined by light barrier.

Both protrusion 64 and light barrier 40 form an optical barrier to optically shield the sections from each other. The first opaque material used for the light barrier 40 and the second opaque material used for the casing can be different compounds. For example, the first opaque material includes thermosetting plastics, silicone rubber gels or epoxy used in potting of electronics. Using different opaque materials may further improve thermomechanical stability of the optical sensor arrangement. For example, one material may be more flexible than the other such that mechanical stress can be compensation by a certain degree of elasticity between the connection of the light barrier and casing.

The optical sensor arrangement can be used in different devices which comprise a host system wherein at least one optical sensor arrangement is embedded or integrated in. For example, the optical sensor arrangement can be configured as a proximity detector. The host system comprises one of a mobile device, a display, lighting system, camera with autofocus system or any other host system which uses information on the presence of nearby objects without any physical contact.

For example, the mobile device can be a mobile phone, Smartphone, computer, wearable, smartwatch, tablet or the like. The optical sensor arrangement can be implemented into the mobile device. The optical sensor arrangement comprises internal electronics for its operation such as a microprocessor or state machine, or the like. However, the device may also provide or complement electronics to operate the optical sensor arrangement.

In another example, the optical sensor arrangement is configured as a time-of-flight sensor. The host system comprises one of a mobile device, a 3D-camera, or a spectrometer, or any system that uses distance information. For example, a 3D-camera as host system comprises a time-of-flight, TOF, camera and is configured for 3D imaging. Typically, such as system comprises an illumination unit such as a photodiode or laser diode. One example illumination unit comprises a Vertical Cavity Surface Emitting Laser, VCSEL, to illuminate an external object. Typically the illumination unit emits modulated light with high speeds up to some 100 MHz. Alternatively, a single pulse per frame such as 30 Hz can be used. The light emitter of the optical sensor arrangement can be used as illumination unit or contribute to the illumination unit.

The optical sensor arrangement can be used to determine a time-of-flight to the external object, for example, the light detector can be read out and provide a sensor signal which is a direct measure of the time the light has taken to travel from the illumination unit to the object and back to the array. The host system, e.g. an imaging device, comprising the optical sensor arrangement comprises driver electronics to control the illumination unit and the optical sensor arrangement. Furthermore, the optical sensor arrangement may have an interface in order to communicate with the host system. In a 3D-camera imaging system two types of images may be generated: a regular 2D image and an additional 1D image with distance information. These two images can be combined to yield a 3D image.

Decoupling of the casing and mold layer can be achieved in different ways. The hollow space, e.g. implemented as gap 63, can be carried out in different designs. The embodiments in FIGS. 4A to 4C below and in FIGS. 1A and 1B should be considered examples but not limiting. For example, the gap 63 introduced in FIGS. 1A and 1B may have no contact points other than the boundary area 12 and light barrier 40. In other embodiments the hollow space or gap can be interrupted by further contact points, contact areas and/or filler materials, such as glue or intermediate layers of elastic material. Examples will be discussed below in FIGS. 4A to 4C.

Figure 4A:
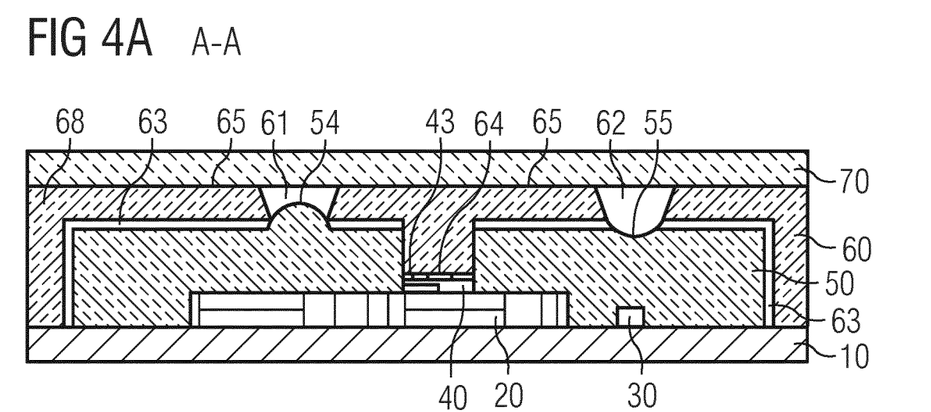
FIGS. 4A to 4C show further example embodiment optical sensor arrangements.

FIG. 4A shows another example embodiment of an optical sensor arrangement. The optical sensor arrangement is based on the one presented above with respect to FIGS. 1A and 1B. However, the protrusion 64 of the casing fits into the incision 51 of the mold layer 50. For example, the incision 51 and the light barrier 40 may have the same height and width such that the barrier width 42 fits into the width 59 of the incision 51. In some embodiments these widths may leave a certain gap which is filled with glue or adhesive, for example. In a certain sense the hollow space or gap 63 is interrupted at or around the light barrier 40.

Figure 4B:
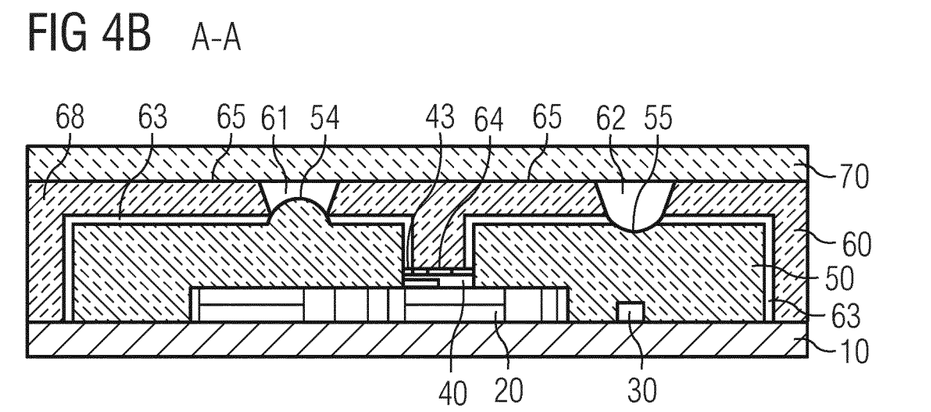

FIG. 4B shows another example embodiment of an optical sensor arrangement. The optical sensor arrangement is based on the one presented above with respect to FIGS. 1A and 1B. In this example embodiment the hollow space or gap 63 extends uninterrupted along the whole mold layer 50 and the interior side of casing 60 (as in the embodiment of FIGS. 1A and 1B, for example). However, the hollow space or gap 63 is filled with a filler material. The filler material may be applied, molded, potted or coated on the mold layer 50 in an intermediate step. For example, the filler material may be a glue or adhesive. Other possible filler materials include polymer or potting material, for example. Furthermore, the filler material may be a stress-decoupling elastomeric material filling the gap 63. In addition, the filler material may further be operable as a spectral filter. This can be achieved by means of the material itself, e.g. due the optical properties such as transmission of the material, or by addition of filler particles such as nano particles, quantum dots or dye molecules having a desired transmission characteristic.

Figure 4C:
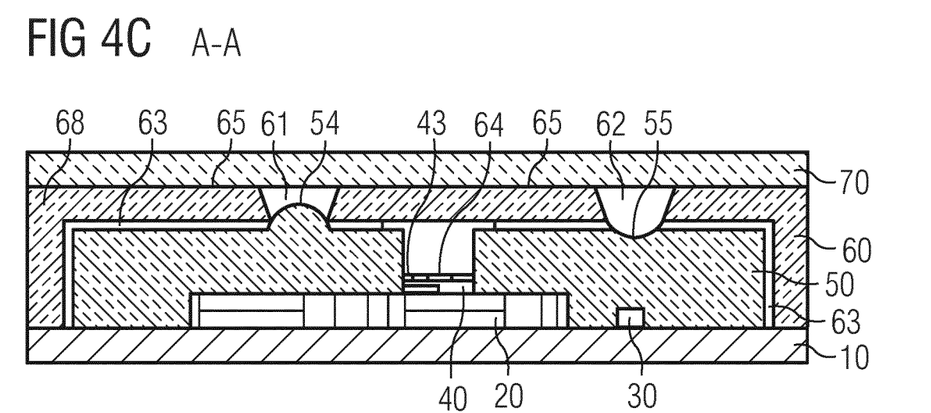

FIG. 4C shows another example embodiment of an optical sensor arrangement. The optical sensor arrangement is based on the one presented above with respect to FIGS. 1A and 1B. However, in this embodiment the casing 60 does not have a protrusion 64 which extends into the incision 51 or would establish contact with the light barrier 40 when mounted. Instead contact between the light barrier 40 and casing 60 is established with the filler material introduced above. For example, the incision 51 is filled with adhesive or glue (or other filler material) until it fills part of the gap 63 between the casing 60 and mold layer 50. This can be an advantage in some instances, for example, if the dimensions of the protrusion are difficult to control it can be eliminated which may further cost of manufacture.

The invention claimed is:

1. An optical sensor arrangement, comprising:
   a substrate having a surface;
   an integrated circuit comprising a first optical detector operable to detect light of a wavelength range, wherein the integrated circuit and a light emitter are mounted onto the surface, the light emitter being operable to emit light in the wavelength range, and wherein the integrated circuit and the light emitter are electrically connected to each other and to the substrate;
   a light barrier formed between the first optical detector and the light emitter comprising a first optically opaque material disposed along a profile of the integrated circuit;

a mold layer encapsulating the integrated circuit the light emitter, and at least a portion of the substrate with an optically transparent material; and a casing mounted to the light barrier made from a second optically opaque material and enclosing a hollow space between the casing and the mold layer, wherein the mold layer comprises a first lens over the first optical detector, wherein the first lens is arranged in the optically transparent material, and the casing comprises a first aperture aligned with the first lens, wherein the hollow space comprises at least one gap between the casing and the mold layer, and the gap is at least partially filled with a stress-decoupling elastomeric filler material, such that the first lens is mechanically decoupled from the casing.

2. The optical sensor arrangement according to claim 1, wherein the integrated circuit comprises a second optical detector which is arranged next to the first optical detector on or in the integrated circuit, and the light barrier is located between the first and the second optical detector along the profile of the integrated circuit.

3. The optical sensor arrangement according to claim 1, wherein the casing comprises:

a continuous body of the opaque material having walls, wherein the walls contact the surface, an inner surface which is separated into two sections by means of a protrusion, wherein the protrusion contacts the light barrier.

4. The optical sensor arrangement according to claim 1, wherein the mold layer comprises an incision cut into the mold layer across the profile such that a surface of the light barrier is clear from the first optically opaque material, and the protrusion extends into the incision and contacts the surface with the casing mounted on the light barrier.

5. The optical sensor arrangement according to claim 1, wherein the substrate comprises a boundary area on the main surface which encircles the integrated circuit and the casing is mounted to the boundary area.

6. The optical sensor arrangement according to claim 1, wherein the mold layer comprises a second lens over the light emitter, wherein the first lens and the second lens are arranged in the optically transparent material and the casing further comprises a second aperture aligned with the second lens.

7. A device comprising:

at least one optical sensor arrangement according to claim 1, wherein the optical sensor arrangement is configured to collect proximity signals; and a host system wherein the at least one optical sensor arrangement is integrated in.

8. A device comprising:

at least one optical sensor arrangement according to claim 1, wherein the optical sensor arrangement is configured to collect time-of-flight signals; and a host system wherein the at least one optical sensor arrangement is integrated in.

9. A method of manufacturing an optical sensor arrangement, the method comprising:

providing a substrate having a surface and providing an integrated circuit comprising a first optical detector operable to detect light of a wavelength range;

mounting the integrated circuit and a light emitter onto the surface, the light emitter being operable to emit light in the wavelength range;

electrically connecting the integrated circuit and the light emitter to each other and to the substrate;

forming a light barrier between the first optical detector and the light emitter by dispensing a first optically opaque material along a profile of the integrated circuit;

forming a mold layer by at least partly encapsulating the substrate, the integrated circuit and the light emitter with an optically transparent material; and mounting a casing, made from a second optically opaque material, on the light barrier and thereby enclosing a hollow space between the casing and the mold layer, wherein the mold layer is formed by a molding and/or casting process, wherein the molding and/or casting process involves arranging a first lens over the first optical detector, and the mounting the casing involves arranging and aligning a first aperture with the first lens, wherein the casing is formed using a mold tool such that mounting the casing leaves a gap between the casing and the mold layer, the gap being at least partially filled with a stress-decoupling elastomeric filler material, such that the first lens is mechanically decoupled from the casing.

10. The method according to claim 9, wherein the casing is formed using the mold tool such that the casing comprises:

a continuous body of the opaque material having walls, wherein the walls contact the surface when the casing is mounted to the light barrier, an inner surface which is separated into two sections by means of a protrusion, wherein the protrusion contacts the light barrier, when the casing is mounted to the light barrier.

11. The method according to claim 9, wherein the molding and/or casting process involves arranging a second lens over the light emitter, and mounting the casing involves arranging and aligning a second aperture with the second lens.

12. An optical sensor arrangement, comprising:

a substrate having a surface;

an integrated circuit comprising a first optical detector operable to detect light of a wavelength range, wherein the integrated circuit and a light emitter are mounted onto the surface, the light emitter being operable to emit light in the wavelength range, and wherein the integrated circuit and the light emitter are electrically connected to each other and to the substrate;

a light barrier formed between the first optical detector and the light emitter comprising a first optically opaque material disposed over a common die surface and along a profile of the integrated circuit;

a mold layer encapsulating the integrated circuit, the light emitter, and at least a portion of the substrate with an optically transparent material; and a casing mounted to the light barrier made from a second optically opaque material and enclosing a hollow space between the casing and the mold layer, wherein the mold layer comprises a first lens over the first optical detector, wherein the first lens is arranged in the optically transparent material, and the casing comprises a first aperture aligned with the first lens, wherein the hollow space comprises at least one gap between the casing and the mold layer, and the gap is at least partially filled with a stress-decoupling elastomeric filler material, such that the first lens is mechanically decoupled from the casing.

\* \* \* \* \*